United States Patent
Thomsen et al.

(10) Patent No.: US 8,471,629 B2
(45) Date of Patent: Jun. 25, 2013

(54) PROVIDING AUTOMATIC POWER CONTROL FOR A POWER AMPLIFIER

(75) Inventors: Axel Thomsen, Austin, TX (US);
Zhongda Wang, Sunnyvale, CA (US);
Sai Chu Wong, San Jose, CA (US);
Yunteng Huang, Palo Alto, CA (US)

(73) Assignee: Silicon Laboratories Inc, Austin, TX (US)

( * ) Notice: Subject to any disclaimer, the term of this patent is extended or adjusted under 35 U.S.C. 154(b) by 48 days.

(21) Appl. No.: 13/173,791

(22) Filed: Jun. 30, 2011

(65) Prior Publication Data
US 2013/0002357 A1    Jan. 3, 2013

(51) Int. Cl.
H03F 1/14    (2006.01)
H03G 3/20    (2006.01)

(52) U.S. Cl.
USPC .............................................. 330/51; 330/129

(58) Field of Classification Search
USPC ................................... 330/129, 127, 297, 51
See application file for complete search history.

(56) References Cited

U.S. PATENT DOCUMENTS

| | | |
|---|---|---|
| 5,128,629 A | 7/1992 | Trinh |
| 5,159,283 A | 10/1992 | Jensen |
| 5,278,994 A | 1/1994 | Black et al. |
| 5,313,658 A | 5/1994 | Nakamura |
| 5,350,908 A * | 9/1994 | Bechtel .................... 235/462.29 |
| 5,371,473 A | 12/1994 | Trinh et al. |
| 5,515,008 A | 5/1996 | Ueda et al. |
| 5,530,923 A | 6/1996 | Heinonen et al. |
| 5,548,616 A | 8/1996 | Mucke et al. |
| 5,905,962 A | 5/1999 | Richardson |
| 6,032,052 A | 2/2000 | Richardson |
| 6,181,188 B1 | 1/2001 | Shibata |
| 6,553,212 B1 | 4/2003 | Wey |
| 6,734,729 B1 | 5/2004 | Andrys et al. |
| 6,735,420 B2 | 5/2004 | Baldwin |
| 6,795,712 B1 | 9/2004 | Vakilian et al. |
| 6,801,759 B1 | 10/2004 | Saifuddin |
| 6,828,859 B2 | 12/2004 | Dupuis |
| 6,868,279 B2 | 3/2005 | Sahlman et al. |
| 7,075,969 B2 | 7/2006 | Zeira et al. |
| 7,092,686 B2 | 8/2006 | Amanullah et al. |
| 7,095,988 B2 | 8/2006 | Ben-Ayun et al. |
| 7,106,805 B2 | 9/2006 | Atkinson et al. |
| 7,110,724 B1 | 9/2006 | Epperson et al. |
| 7,170,953 B2 | 1/2007 | Kaczynski |
| 7,209,717 B2 | 4/2007 | Okada et al. |
| 7,340,235 B1 | 3/2008 | Madsen et al. |
| 7,353,006 B2 | 4/2008 | Gels et al. |

(Continued)

OTHER PUBLICATIONS

Silicon Labs, "EZRadio and EZRadioPro, Complete family of transmitters, transceivers and receivers" 2010, pp. 1-2.

*Primary Examiner* — Robert Pascal
*Assistant Examiner* — Khiem Nguyen
(74) *Attorney, Agent, or Firm* — Trop, Pruner & Hu, P.C.

(57) ABSTRACT

A power control circuit is coupled to receive a feedback signal from a power amplifier (PA) and generate a control signal to control a variable gain amplifier (VGA) coupled to an input to the PA based on the feedback signal. The power control circuit may include, in one embodiment, a mute circuit to generate a mute signal to be provided to the VGA when the control signal is less than a first level and a clamp circuit to clamp a control voltage used to generate the control signal from exceeding a threshold level.

20 Claims, 7 Drawing Sheets

U.S. PATENT DOCUMENTS

| | | |
|---|---|---|
| 7,471,935 B2 | 12/2008 | Barak et al. |
| 7,711,327 B2 | 5/2010 | Sowlati et al. |
| 2002/0142741 A1 | 10/2002 | Molnar et al. |
| 2004/0198261 A1 | 10/2004 | Xiong |
| 2005/0130595 A1 | 6/2005 | Shurvinton et al. |
| 2005/0218989 A1 | 10/2005 | Tsutsui et al. |
| 2008/0076378 A1 | 3/2008 | Lim et al. |

* cited by examiner

PROVIDING AUTOMATIC POWER CONTROL FOR A POWER AMPLIFIER

BACKGROUND

Many radio communication devices include amplifier circuitry to increase the gain and power of a radio frequency (RF) signal before its transmission via an antenna. Oftentimes, a power amplifier (PA) is part of the amplifier circuitry to provide final power amplification before output. Such power amplifiers can operate in different modulation schemes, each of which can have different specifications. For example, in an on/off keying (OOK) application, data bits are transmitted at a first power level (e.g., on) to indicate a first state (e.g., logic high) and at a second power level (e.g., off) to indicate a second state (e.g., logic low). Typical specifications for OOK applications state that transitions from a very low output power (e.g., 70 dB below full scale) to full output power (and back again) occur in a well-controlled manner to meet modulation depth specifications to not generate out-of-band frequency components, reduce bit error rate, unwanted spurious emissions and signal-occupied bandwidth.

SUMMARY OF THE INVENTION

According to one aspect of the present invention, a power control circuit can receive a feedback signal from a power amplifier (PA) and generate a control signal to control a variable gain amplifier (VGA) coupled to an input to the PA based on the feedback signal. The power control circuit may include, in one embodiment, a mute circuit to generate a mute signal to be provided to the VGA when the control signal is less than a first level and a clamp circuit to clamp a control voltage used to generate the control signal from exceeding a threshold level. In this embodiment, the power control circuit may further include an integrator to integrate the feedback signal, an offset signal, and a ramp reference signal to obtain an integrator output corresponding to the control voltage.

Another aspect of the present invention is directed to a method including receiving a feedback signal from an output of a PA, combining a feedback current generated from the feedback signal with an offset current and a ramp current to obtain a current sum, and providing the current sum to an integrator having an integrator output. Then a control signal is provided to a VGA that amplifies a radio frequency (RF) signal in the VGA and a gain stage coupled between the VGA and the PA when the integrator output is within a first range. Further, a mute signal is provided that prevents a feed through signal from being amplified in at least one of the VGA and the gain stage when the integrator output is within a second range in which the control signal is not provided.

A still further aspect is directed to a system that includes a processor and a transceiver coupled to the processor. The transceiver may include a VGA to receive and amplify an RF signal, a gain stage coupled to an output of the VGA to further amplify the RF signal, and a PA coupled to the gain stage to amplify the RF signal for transmission from the transceiver. A power control circuit may be coupled to receive a feedback signal from the PA to control the VGA based on the feedback signal. In one embodiment, the power control circuit can enable the VGA during an on-keying state and disable the VGA during an off-keying state, and to further provide a mute signal to the VGA during the off-keying state to prevent a feed through signal from being amplified by the VGA.

DETAILED DESCRIPTION

Figure 1A:
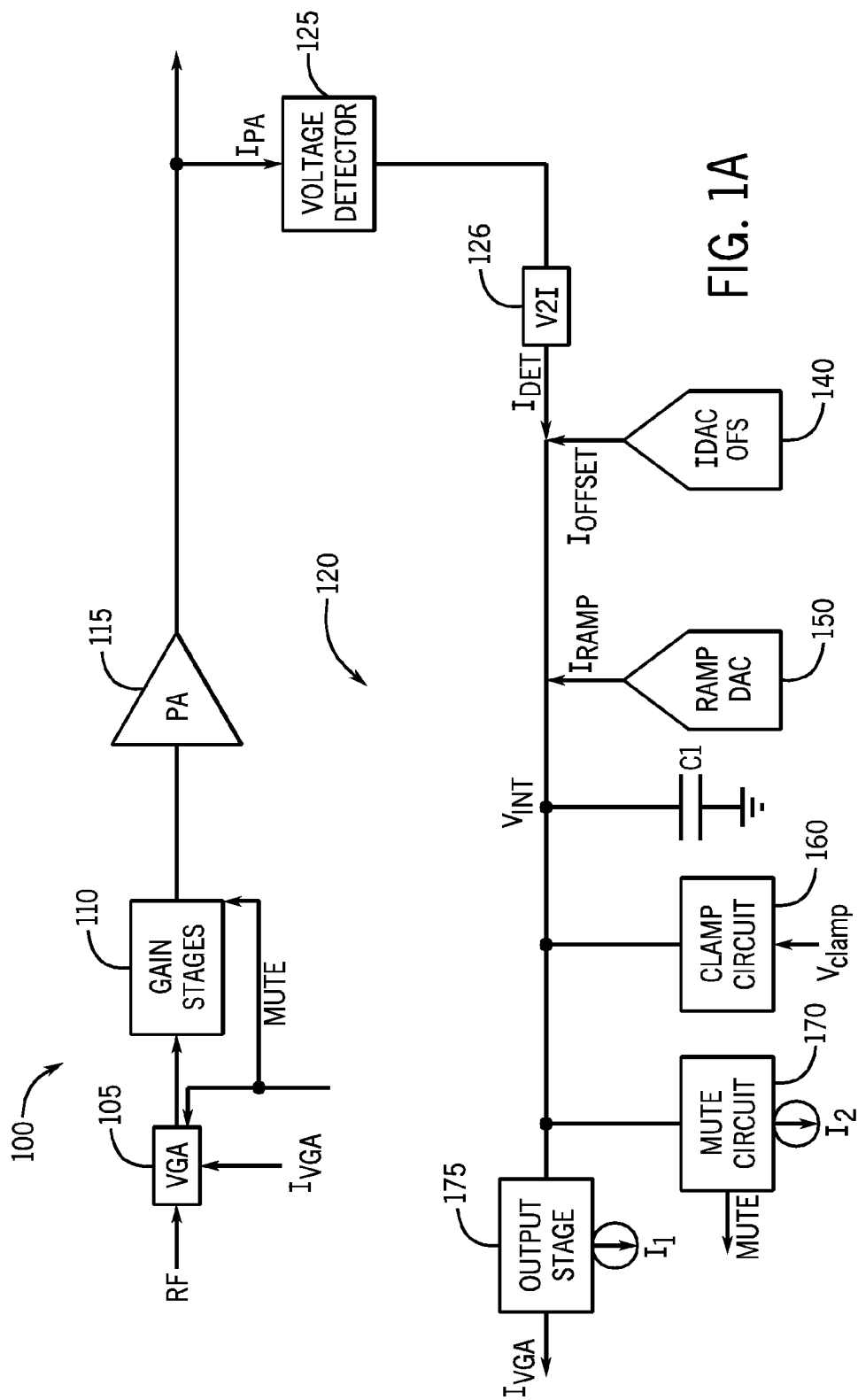
FIG. 1A is a block diagram of a power control circuit in accordance with an embodiment of the present invention.

In various embodiments, automatic power control (APC) for a power amplifier (PA) of a transmitter or transceiver can be realized. More specifically, based on feedback from the PA output, control signals can be sent to one or more gain stage mechanisms present in a transmit path in front of the PA to control these gain stage elements to thus in turn enable a desired power output from the PA, without any specific control of the PA itself. In various embodiments, a feedback circuit may be coupled between a PA output and an input to pre-amplification circuitry that leads to the PA.

In addition to this automatic power control, because a transceiver may be configured for operation in various modulation schemes, mechanisms can further be provided to enable smooth control of the PA output in different modulation schemes. For example, in an on/off keying (OOK) mode, as discussed above, a wide dynamic range between its low output power state and high output power state can be specified. A feedback circuit in accordance with an embodiment of the present invention can provide for an additional control signal to ensure that in an off-keying state, no output from the PA occurs. Furthermore, to ensure a smooth power up to the on-keying state, additional control circuitry can be provided in the feedback circuit to ensure that in the off state a control signal generated by the control circuit is prevented from falling to less a predetermined value such that a smooth ramp up can occur in an on-state transition.

Embodiments thus provide a closed loop controlled power amplifier. The feedback loop includes an integrator and an associated clamp to hold a state variable (e.g., the integrator output voltage) to a fixed well-defined state serving as the off-key target state. The input to the integrator may include currents from a ramp digital-to-analog converter (DAC) that has a well controlled transition with a programmable rise/fall time, and an offset DAC that enables the feedback loop to servo to a negative amplitude, guaranteeing that the integrator will drive hard to zero and beyond. The clamp provides a well defined off-key state, to enable a fast transition to the on-key state as compared to a brute force power/off or saturated state. This is so, as generally recovery from saturation is a poorly controlled process and therefore not suitable for a fast, well-controlled transient.

An output stage of the loop provides a control signal to a gain circuit in front of the PA. In addition, a mute comparator may be present to engage between a state of no bias current to this gain circuit and a clamped state in which the clamp circuit is active. The mute comparator thus provides a signal that indicates the system is in off-key, and then adds additional attenuation via a mute signal to achieve more on-key and off-key power difference. Note that attenuation added in the off-key state does not affect the control loop's accuracy in the on-key state because the additional attenuation circuits are disabled once the comparator trips and indicates the system is going to on-key. In this way, a feedback circuit achieves fast transitions between PA on/off states and maximizes on/off power difference at the same time.

Referring now to FIG. 1A, shown is a block diagram of a power control circuit in accordance with an embodiment of the present invention. As seen in FIG. 1A, a portion of a system 100 is shown. In various embodiments, system 100 may be one of a varied type of computing system, peripheral device, portable device, ISM device or so forth that includes a transmitter or transceiver. Note that as used herein, the term "transmitter" means a standalone transmitter or a transmit portion of a transceiver or other device. Many systems or devices may include a short-range wireless transceiver to both transmit and receive RF signals in a local environment. As shown in FIG. 1A, as part of a transmit path of the transceiver, an RF signal including modulated data at a carrier frequency is provided to various gain stages. Specifically as shown in FIG. 1A, the RF signal may be provided to a variable gain amplifier (VGA) 105. In various embodiments, VGA 105 may have a controllable gain based on a control signal received from a feedback circuit 120, which may be an APC circuit in accordance with an embodiment of the present invention. More specifically, a control signal, $I_{VGA}$, may be provided to VGA 105 from feedback circuit 120. As further seen and as will be discussed below a mute signal may also be provided to VGA 105 from feedback circuit 120. Based on the control signal which can be a control current, the incoming RF signal to VGA 105 may be amplified accordingly. The resulting amplified signal may be provided to a set of gain stages 110 which may be a plurality of fixed gain stages, in some embodiments. For example, in one embodiment four such gain stages may be provided. As further seen, the mute signal may also be provided to at least one of these gain stages. Thus the output from gain stages 110 may correspond to a RF signal that has been amplified and conditioned and is ready to be further amplified to a desired transmission power level in a PA 115. In various embodiments, PA 115 may be a power amplifier present in the transceiver itself, although in other embodiments the PA may be off-chip. In any event, the PA amplifies the received signal and provides the amplified signal as an output, e.g., to an antenna or other radiation circuitry (not shown for ease of illustration in FIG. 1A).

As further seen in FIG. 1A, the PA output current, $I_{PA}$, is further coupled to a voltage detector 125 of feedback circuit 120. In general, this voltage detector can generate a voltage corresponding to the output current from the PA. As further seen in FIG. 1A, the voltage output from detector 125 may be provided to a converter 126, where this voltage may be converted to a current. The current, I_det, corresponding to the detected PA output current from current converter 126 can be combined with several other currents, namely an offset current generated in an offset DAC 140 and a ramp control current generated in a ramp DAC 150. The corresponding current sum may be coupled to an integrator formed of a capacitor C1, which provides for smoothing and filtering, and during an on-key state, the sum of the currents may equal zero.

If the integrator output at an integrator node Vint itself were provided to control the VGA, it is possible that for a given modulation scheme such as OOK, transitions between different states may not be achieved as desired and/or specified modulation depths between the on/off states may not fully occur. Thus, the control signal may be modulated via a clamp circuit 160, such that the voltage at the integrator output is controlled to prevent the corresponding control signal to the VGA from dropping to an undesirable level in an off-key state. The resulting control signal may be provided through an output stage 175 as the control signal $I_{VGA}$ to the VGA.

In addition, as will be discussed further below, a mute control circuit 170 may generate a mute signal to be provided to the VGA and one or more of the fixed gain stages to thus mute their output when the PA is outputting an off-keyed value. In this way, parasitics or other adverse signal degradations can be prevented from being coupled to and thus being amplified by the PA. In general, this mute signal may be generated when a small amount of a control signal is output to the VGA.

In general the PA output current $I_{PA}$ is directly related to transmit power. When $I_{PA}$ is zero, there is no transmit power to the antenna/load. When $I_{PA}$ equals a transmit target value, the PA will transmit power into the antenna/load with the target power. When PA 115 is transmitting, e.g., in the on-key state, clamp circuit 160 does not clamp and appears as a high impedance, and the mute signal is low. Feedback circuit 120 has a high loop gain so that the steady state will be I_det=I_{ramp-steady-state}+I_offset+I_{delta} where I_{delta} is a very small tracking error due to the large loop gain. One could program I_{ramp-steady-state}+I_offset in order to control the I_{det}, and thus $I_{PA}$, and thus the transmit power.

When PA 115 is not transmitting, e.g., in the off-key state, I_ramp equals zero. Here, clamp circuit 160 is enabled and the mute signal is high. The loop gain will be reduced to a very small value (much lower than 1), and feedback circuit 120 is in a virtually open loop state. As a result, $I_{PA}$ is ideally zero, since the mute signal is degenerating all the gain stages. The voltage at the integrator node Vint is clamped at a voltage where output stage 175 is in a well-defined bias condition so that when a transition to the on-key state occurs, output stage 175 can start to increase $I_{VGA}$ in a smooth/fast manner. In this off-key state, since various circuits generate random offsets/noise, in reality, I_det=$I_{PA}$*gain (Voltage detector 125+converter 126)+Offset_{random}. Setting I_{ramp} equal to zero and I_{offset} as a negative number will ensure that $I_{PA}$ equals zero. Without I_{offset} being negative, Offset_{random} might cause still an available transmit signal, although the control loop thinks there is no transmit signal.

When going from the off-key state towards the on-key state, I_{ramp}(t) will be generated as a signal going from zero to a target I_{ramp} value. Since clamp circuit 160 only clamps in one direction (for example, clamps when Vint is trying to go high, but not restricting Vint from going low as in the following detailed circuit implementation), increasing I_ramp(t) will start to decrease Vint, and $I_{VGA}$ will start to increase. At a defined $I_{VGA}$ value called I_{trip}, the mute signal is released from high to low. Then PA 115 starts to transmit, and feedback circuit 120 returns into a high loop gain on-key mode. $I_{PA}$ will track I_ramp (t)+I_offset until I_ramp(t) reaches its target steady state value.

When going from the on-key state towards the off-key state, I_{ramp}(t) will be generated as a signal going from a target on-key value towards zero. $I_{VGA}$ starts to decrease, and once it is as low as I_{trip}, the mute signal is tripped from low to high to mute the gain stages.

A negative I_offset causes Vint to go high until clamp circuit 160 clamps it to a predefined voltage so that output stage 175 is in a well-defined state and remains there. $I_{VGA}$ is ideally zero in the off-key state.

In both ramp up (from off-key to on-key) and ramp down (from on-key to off-key), $I_{PA}$ is closed loop controlled/tracked by the I_ramp (t) signal. In various embodiments, I_ramp(t) curves can be generated to control the $I_{PA}$ in a desired/preferred ramping profile.

Thus the control loop of feedback circuit 120 operates such that it enters an open loop (low loop gain) in the off-key state and a closed loop (high loop gain) in the on-key state. Clamp circuit 160 ensures that output stage 175 is always in a well-defined state to ensure smooth transition between the two states, and in turn the mute signal ensures a very low $I_{PA}$ in the off-key state.

Although shown with this high level view in the embodiment of FIG. 1A, understand the scope of the present invention is not limited in this regard, and further that certain details of a particular embodiment are not shown in FIG. 1A for ease of illustration.

Figure 1B:
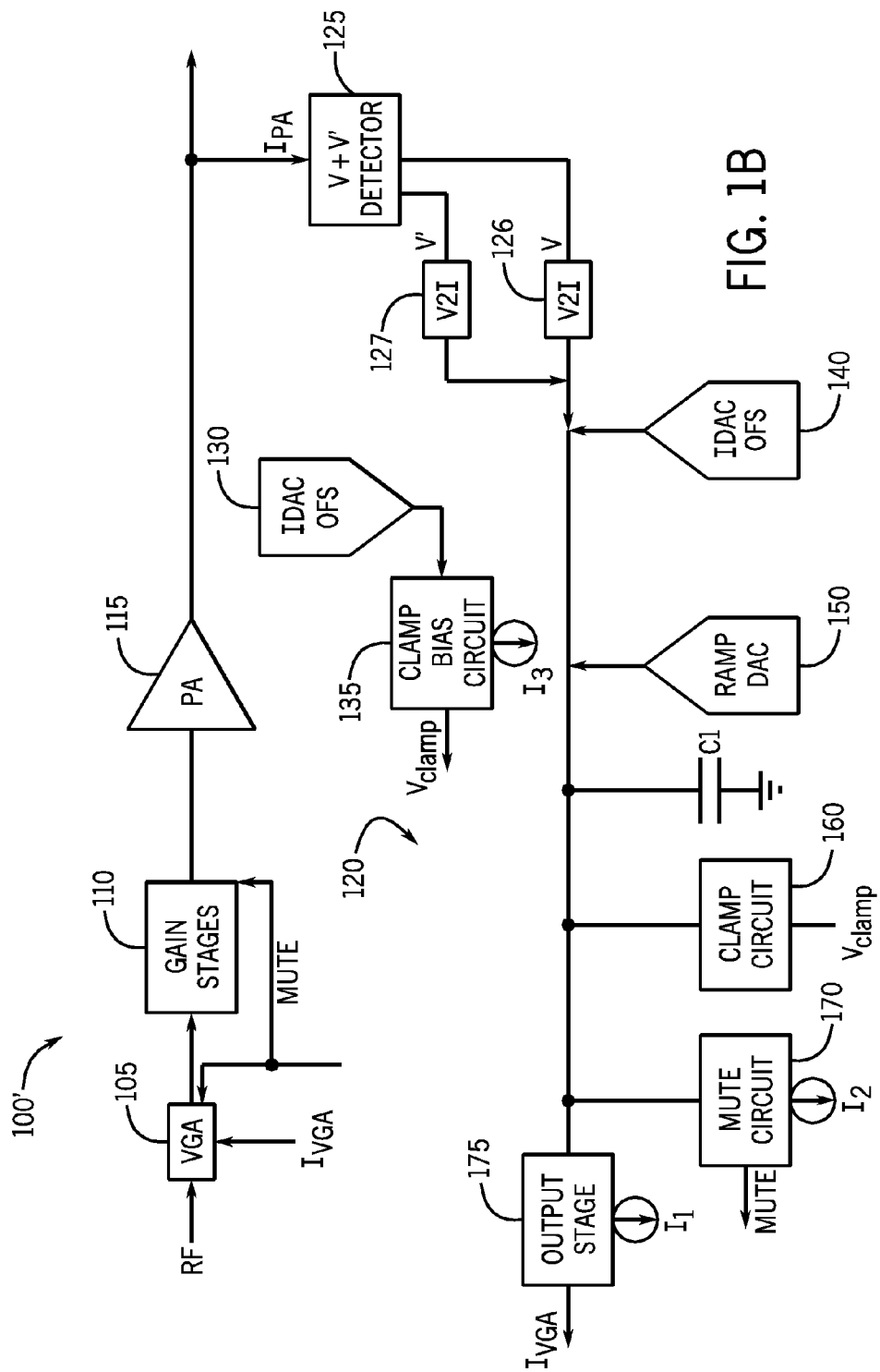
FIG. 1B is a block diagram of a power control circuit in accordance with another embodiment of the present invention.

Referring now to FIG. 1B, shown is a block diagram of a power control circuit in accordance with another embodiment of the present invention. In general, system 100' may be configured with a feedback loop similar to that of FIG. 1A. However in this embodiment, details of bias circuitry used to generate a bias voltage for clamp circuit 160 are shown. Specifically, a clamp bias circuit 135 is configured to receive a current from an offset DAC 130 and generate a clamp bias voltage Vclamp to bias clamp circuit 160. In addition, note that in FIG. 1B, voltage detector 125 may further be used to generate a replica voltage V', that corresponds to a zero current output from the PA, and which can be used for purposes of automatic power control. Although shown with a single voltage detector in the embodiment of FIG. 1B, understand that in various embodiments different detectors (or at least different circuitry) may be present to enable each voltage to be detected. The remaining circuitry of system 100' may be as in FIG. 1A. Although shown with this high level view in the embodiment of FIG. 1B, understand the scope of the present invention is not limited in this regard.

Figure 2:
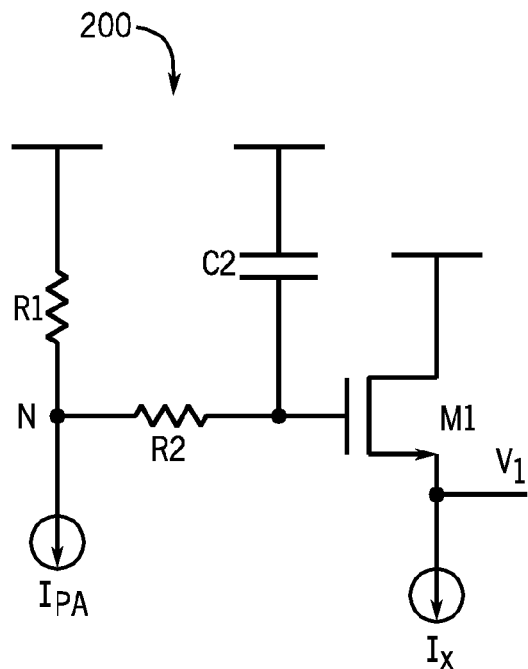
FIG. 2 is a schematic diagram of a voltage detector in accordance with an embodiment of the present invention.

Referring now to FIG. 2, shown is a schematic diagram of a voltage detector in accordance with an embodiment of the present invention. More specifically, voltage detector 200 shown in FIG. 2 may be used to detect a voltage that corresponds to the output current from the PA, which is shown in FIG. 2 as a current source $I_{PA}$, coupled to an inter-resistor node N. Resistor R1 may be coupled to a supply voltage, and in turn, resistor R2 may couple in series to a gate of an NMOS device M1, which provides the detected voltage at its source terminal, further having a current source Ix coupled to it. More specifically, this voltage may correspond to an average of the output current, as filtered by the filter formed of resistor R2 and capacitor C2. As seen above in FIG. 1, this detected voltage V may be provided to a voltage-to-current converter.

Figure 3:
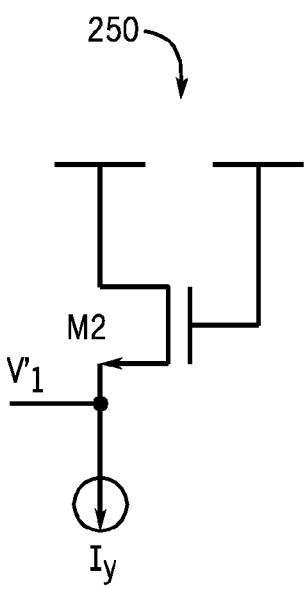
FIG. 3 is a schematic diagram of another voltage detector in accordance with one embodiment of the present invention.

FIG. 3 is a schematic diagram of another voltage detector 250. Specifically, voltage detector 250 may be used to generate a voltage corresponding to the zero current output, in other words, a reference current from the PA that is used for purposes of replica circuitry. Thus this replica voltage detector includes an NMOS device M2 having drain and gate terminals coupled to a supply voltage and which provides a detected voltage V' at its source terminal, further having a current source Iy coupled to it. In one embodiment, MOSFETS M1 and M2 and current sources Ix and Iy may be sized the same, although in other embodiments, the devices can be separately sized for overcoming offsets or for other reasons.

Figure 4:
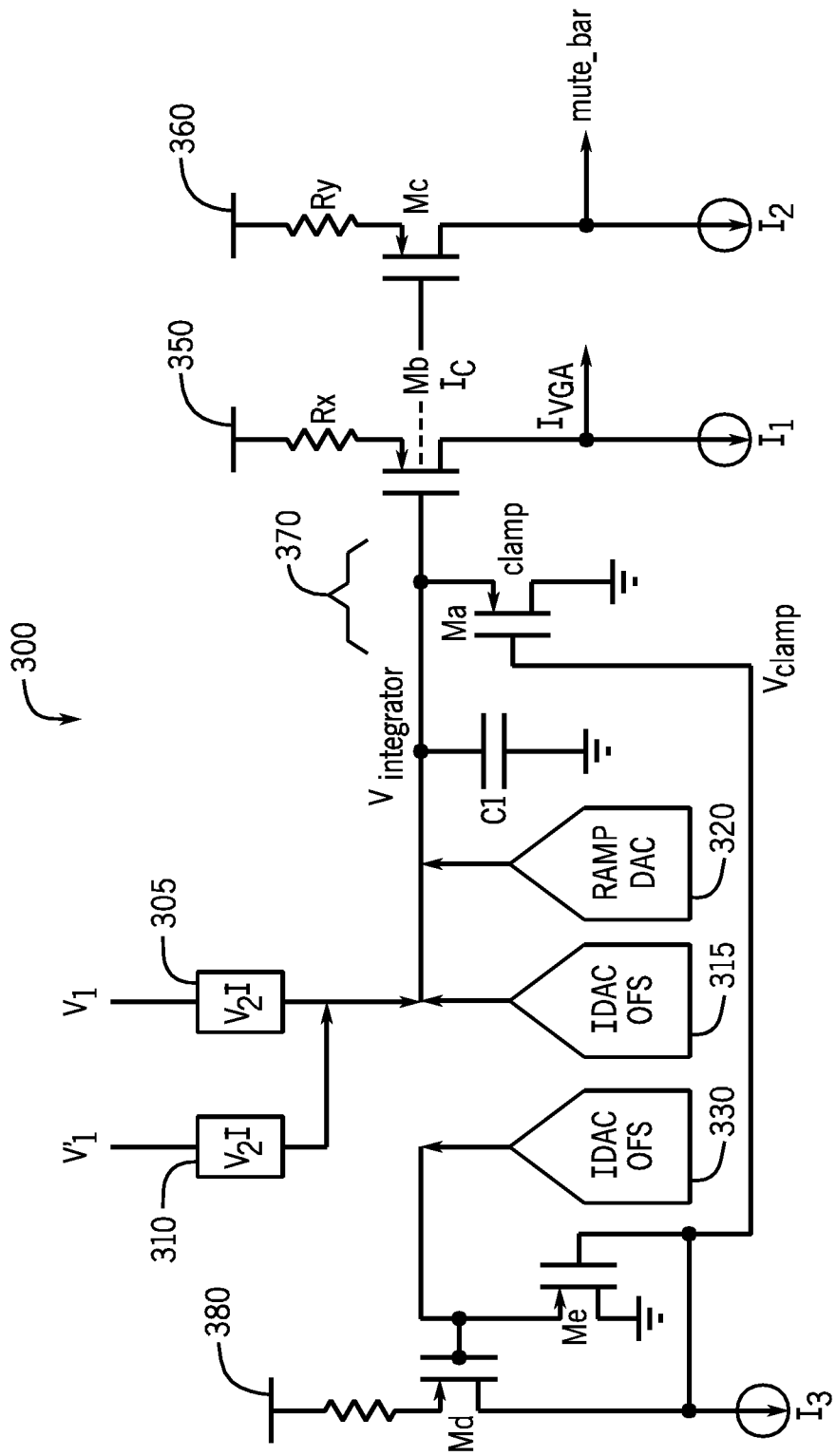
FIG. 4 is a schematic diagram illustrating detail of various components of an automated power control feedback circuit in accordance with one embodiment of the present invention.

Referring now to FIG. 4, shown is a schematic diagram illustrating in more detail various components of a APC feedback circuit in accordance with one embodiment of the present invention. Specifically, FIG. 4 shows a portion 300 of the feedback circuit in which the detected feedback voltage and the replica voltage are provided to voltage-to-current converters 305 and 310, respectively. In one embodiment, these converters may be implemented via transconductance amplifiers.

With regard to the feedback signal path, the generated feedback current may be combined with an offset current and ramp current obtained from offset DAC 315 and ramp DAC 320, respectively. In one embodiment, offset DAC 315 may generate a fixed reference current which may provide an offset current value to ensure that a hard turnoff of the output power from the PA occurs during an off-keying state. In this way, the control signal provided to the VGA may ensure zero VGA output, even in the case of mismatch of devices, noise and so forth. In turn, ramp DAC 320, which may be implemented using a set of current multiplier DACs, can be used to provide a controllable slope that enables the desired ramp envelope shape for an on-keying state. And in an off-keying state, ramp DAC 320 may output zero current.

These combined currents may thus be provided to an integrator formed in the embodiment of FIG. 4 of a capacitor C1 coupled between a voltage node $V_{integrator}$ and a reference node (e.g., ground).

The integrator output voltage gates an output stage 350 which as shown in FIG. 4 may be formed of a PMOS device Mb having a gate terminal coupled to this $V_{integrator}$ voltage node, a source terminal coupled to a supply voltage through a degeneration resistor Rx and a drain terminal configured to output a drain current that is used to form the control signal $I_{VGA}$. Note further that a current source I1 is coupled to this drain terminal. Thus this PMOS sums its drain current with current source I1 such that the current source is subtracted from the drain current to obtain an $I_{VGA}$ provided as the control signal to which acts as a bias current for the VGA. Thus the VGA is controlled to be off unless the value of the drain current is greater than To provide further assurance that no signal bleeds through the amplifier path leading to the PA, which would cause outputting of an undesired power level during an off-keying encoding, a mute signal may also be generated, as discussed above. To generate the mute signal, a replica output stage 360 may be present. As seen, replica stage 360 may include a PMOS device Mc having a gate terminal coupled to the voltage node $V_{integrator}$, a source terminal coupled to a supply voltage via a degeneration resistor Ry and a drain terminal to provide a drain current used to form the mute signal. As further seen, a current source I2 may couple to the drain terminal. Replica circuit 360 may thus act as a comparator such that the current source I2 is subtracted from the drain current to generate the mute signal. This mute-bar signal will go low (mute will be high) when the current of Mc is smaller than I2, which indicates that the loop is on the verge of entry into the off-key state. This is so, as there may be a size difference between the two PMOS transistors Mb and Mc, and current source I2 may be less than current source I1.

To further provide for fast transitions from the off-keying state to the on-keying state, feedback circuit 300 also provides a clamp circuit 370. In general, clamp circuit 370 may be formed of a PMOS device Ma having a source terminal coupled to the integrator output and a drain terminal coupled to a reference node (e.g., a ground level). As seen in FIG. 4, clamp circuit 370 is gated by a control signal $V_{clamp}$ generated by a bias circuit 380.

Specifically as seen in FIG. 4, bias circuit 380, which may be formed of a pair of PMOS devices Md and Me, is further coupled to receive the current generated from the output of offset DAC 330. As seen, this offset current is coupled to the gate terminal of PMOS Md and the source terminal of PMOS Me. In turn, the drain terminal of PMOS Md is coupled to a current source I3 and in turn to the gate terminals of both PMOS Me as well as providing the gate signal to clamp circuit PMOS Ma. This current source I3 may be less than I2 (which as discussed above is in turn less than current source I1). Thus this clamp circuit activates to prevent the control signal $I_{VGA}$ from falling below a threshold level. As such, the clamp enables a fast transition so that the time to output a control signal $I_{VGA}$ that turns on the VGA in the on-keying state is relatively fast.

Thus as shown in FIG. 4 each of the three current sources I1, I2, I3 is compared with a current flowing through a MOSFET with a degeneration resistor. I3 is used to set the clamp level for the voltage node of the integrator, which is the highest voltage that is permitted, turning off the current flow to the VGA. I2 is used to determine whether to turn on the mute signal, which is a lower voltage of this voltage node than the clamp voltage, but higher than the voltage that sends current to the VGA. In turn, the VGA can be controlled by a control current $I_{VGA}$ that is the sum of I1 and the current of Mb. For example, when I1 is equal to Mb, $I_{VGA}$ is equal to zero, and the VGA has no output. If Mb-I1 is greater than zero, then $I_{VGA}$ is positive and the VGA will generate an output.

As the integrator voltage increases, first the VGA is without current (but with feed through), then the mute signal asserts and the feed through signal is terminated, and then the clamp begins clamping so that the integrator voltage does not increase further. While shown with this particular implementation in the embodiment of FIG. 4, understand the scope of the present invention is not limited in this regard.

Figure 5:
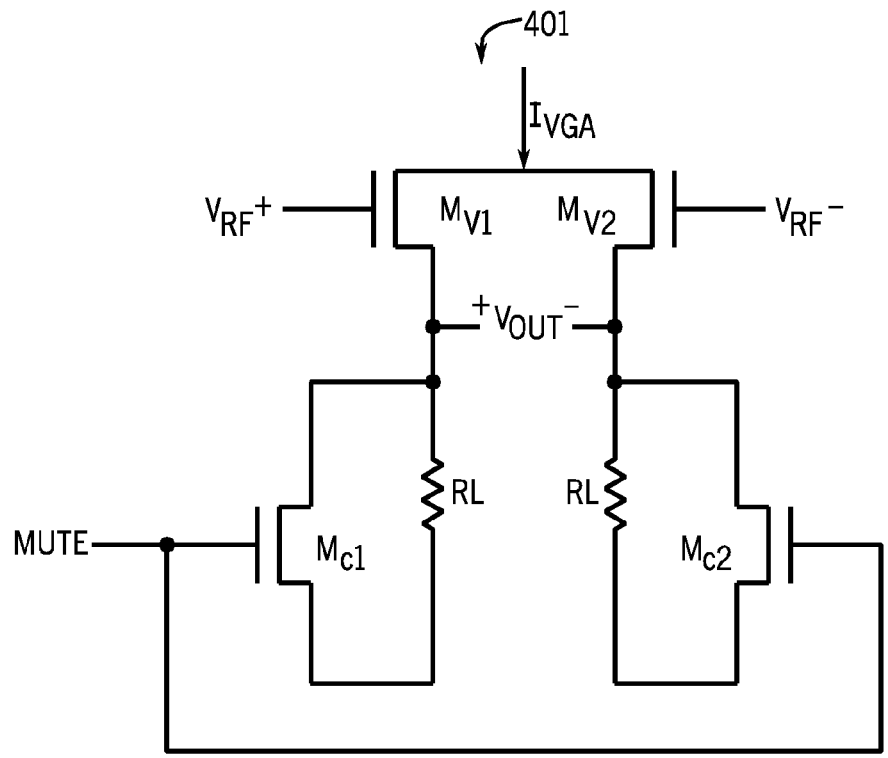
FIG. 5 is a schematic diagram of a gain stage in accordance with an embodiment of the present invention.

Referring now to FIG. 5, shown is a schematic diagram of a gain stage in accordance with an embodiment of the present invention. As shown in FIG. 5, gain stage 401 may correspond to a VGA at a beginning of an amplifier path (also referred to as a pre-amplifier chain) that leads to a PA. As seen, an incoming RF signal VRF+/− is coupled to gate terminals a pair of MOSFETs MV1 and MV2, which may be PMOSs that provide an amplified output signal via load resistors RL responsive to this RF signal and the bias current provided by control signal $I_{VGA}$. Due to parasitic capacitance and other noise sources, even when $I_{VGA}$ is zero, some amount of signal power can feed through as a feed through signal in an off-keying situation. Accordingly, to prevent this undesired output, which would cause the downstream PA to amplify this unwanted signal, the mute control can be provided. Specifically as shown in FIG. 5, the mute control signal is provided to a pair of MOSFETs Mc1 and Mc2 that are coupled in parallel to the load resistors. When this mute control signal is active, the load resistors are thus shorted to prevent any output to downstream amplifier circuitry (not shown in FIG. 5).

Figure 6:
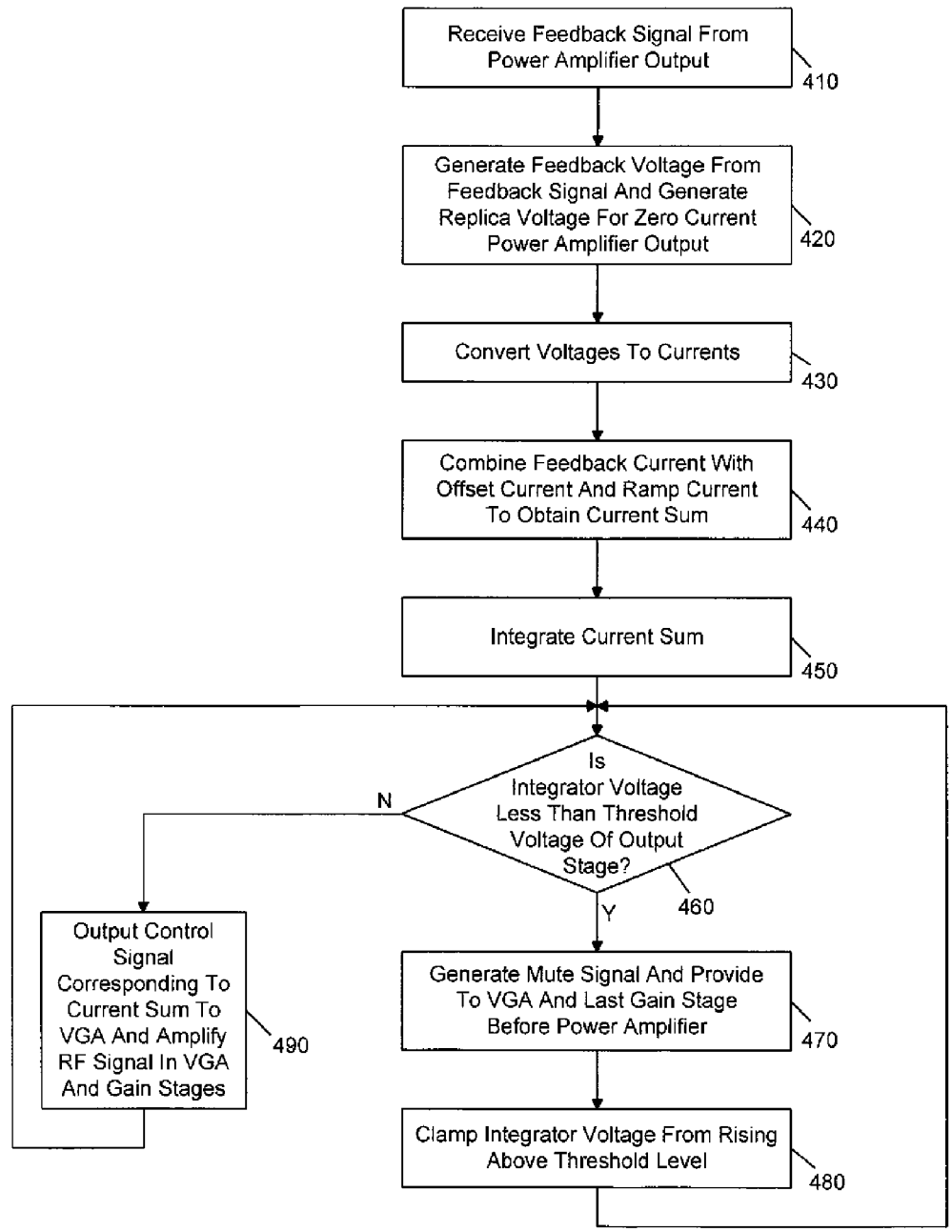
FIG. 6 is a flow diagram of a method of operation of an automated power circuit in accordance with an embodiment of the present invention.

Referring now to FIG. 6, shown is a flow diagram of a method of operation of an automated power circuit in accordance with an embodiment of the present invention. As shown in FIG. 6, method 400 may be implemented in an embodiment of a feedback circuit coupled between a PA output and a control input to a VGA, as well as a control input to at least one fixed gain stage coupled between the VGA and the PA. As seen, method 400 may begin at block 410 by receiving a feedback signal from the PA output. As discussed above, this feedback signal may correspond to the PA output current. In turn, this signal is used to generate a feedback voltage at block 420. In addition, a replica feedback voltage, which corresponds to a zero current output from the PA, can also be generated. These detected voltages can in turn be converted to currents.

Still referring to FIG. 6, for the main feedback path, the generated feedback current can be combined with an offset current and a ramp current to obtain a current sum, which is then integrated in an integrator (blocks 440 and 450).

If the integrator voltage is less than a threshold voltage of an output stage, at diamond 460 (where the output stage can be a PMOS device coupled to a degeneration resistor), control passes to block 470. There, a mute signal may be generated and can be provided both to the VGA and a last one of multiple fixed gain stages coupled between the VGA and the power amplifier to thus ensure that no feed through signal couples to the PA that would cause a undesired parasitic signal to be amplified and output from the PA in an off-keying state. This mute signal may be active while the integrator voltage is within a given range. Control then passes to block 480, where the rising integrator voltage (in an off-key state) is clamped from rising above a threshold level (that is higher than the range at which the mute signal is active), where this threshold level corresponds to a point that allows the output stage to rapidly transition to an on-key state.

If instead the integrator voltage is greater than the threshold voltage of the output stage at diamond 460, control passes to block 490. There, an output control signal corresponding to the current sum can be sent to the VGA when the integrator voltage is in a different, lower range than the active mute signal range. This control signal thus enables the VGA to amplify a received RF signal, which then passes along to the fixed gain stages for further amplification before being provided to the PA for final power amplification and output to an antenna. Note that the control signal that is output corresponds to the current sum as compared to a reference current (e.g., a current source, which is subtracted from the current sum), thus ensuring that the control current that turns on the VGA is only output when the current sum exceeds this current source value. Although shown with this particular implementation in the embodiment of FIG. 6, understand the scope of the present invention is not limited in this regard.

Figure 7:
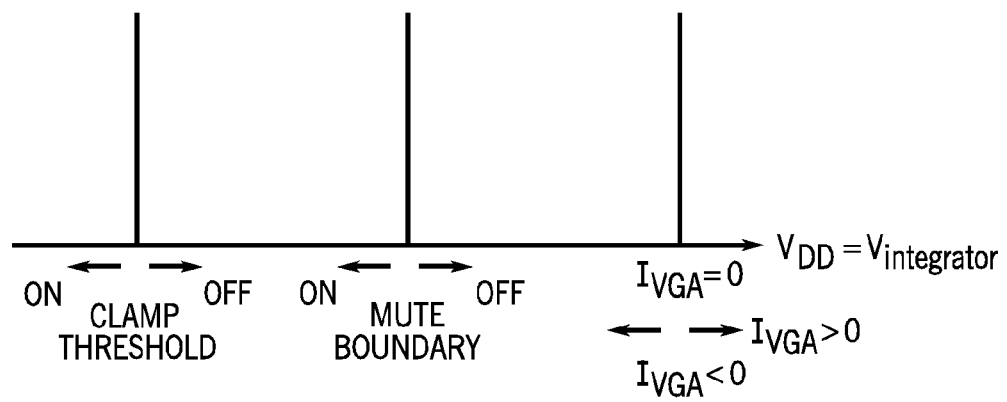
FIG. 7 is a graphical illustration of various transition regions with regard to automatic power control in accordance with an embodiment of the present invention.

Referring now to FIG. 7, shown is a graphical illustration of the various transition regions with regard to automatic power control in accordance with an embodiment of the present invention. As shown in FIG. 7, when the voltage that gates an output device that generates $I_{vGA}$ is below a threshold level, a positive current is provided as the control signal, and the mute control signal is in an off state. When the voltage increases above this threshold, a mute boundary condition is reached such that the mute signal is enabled, to prevent unwanted output through the gain stages leading to the power amplifier. Further, to prevent this control signal from dropping below a threshold level, and to thus enable a fast transition to an on-keying state, the clamp circuit may activate at a clamp threshold level that is below this mute boundary condition.

Figure 8:
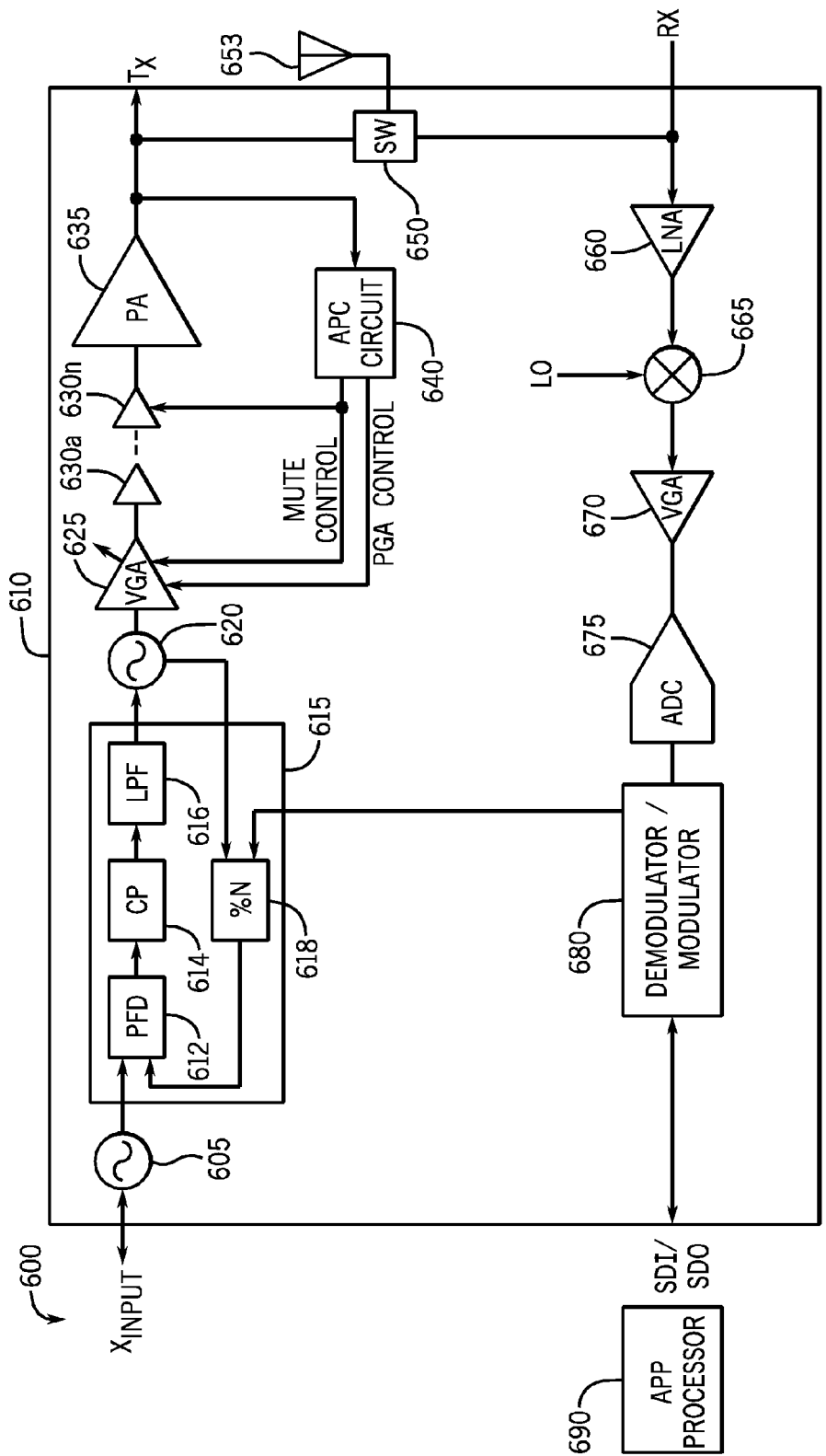
FIG. 8 is a block diagram of a system in accordance with an embodiment of the present invention.

Referring now to FIG. 8, shown is a block diagram of a system in accordance with an embodiment of the present invention. As shown in FIG. 8, system 600 may take various forms, e.g., corresponding to a consumer device including a transceiver 610 in accordance with an embodiment of the present invention. The consumer device can take many different forms, such as a given security or monitoring device, reader device, ISM device or so forth, and which includes the transceiver, e.g., to provide for short-range wireless communication. For ease of illustration, the only components of the system shown in FIG. 8 are an application processor 690, transceiver 610, and an antenna 665. Understand however that various other components may be present in a given embodiment.

In a transmit direction, data to be transmitted may be provided from application processor 690 via a serial data port, which is coupled to a modulator/demodulator 680. The modulated information can be provided to a phase lock loop (PLL) 615, which provides the modulated signal to a voltage control oscillator (VCO) 620 where it is upconverted to a RF frequency. As seen, PLL 615 may be fractional-N PLL including a phase frequency detector 612, coupled to receive a reference frequency via an oscillator 605, a charge pump 614, a low pass filter 616, and an N divider 618.

The resulting RF signal is provided to a VGA 625, which as seen receives a control signal and a mute control signal from an APC circuit 640 which, in one embodiment may correspond to the feedback circuit shown in FIG. 1, which thus controls VGA based on a feedback signal from a PA 635. As seen, multiple fixed gain stages $630_a$-$630_n$ may be coupled between VGA 625 and PA 635. As seen, a last one of these gain stages $630_n$ may also receive the mute control signal. Based on this automatic power control, the PA thus outputs an amplified signal through an antenna switch 650 to antenna 655.

In a receive direction, incoming RF signals may be coupled through switch 650 to a receive path including a low noise amplifier (LNA) 660, which provides an amplified output to a mixer 665, which downmixes the signal according to an LO frequency which may be received, in one embodiment from VCO 620. The downmixed which may be at a zero IF frequency is provided through a VGA 670 and an analog-to-digital converter (ADC) 675, which provides a digital bit stream to demodulator 680, which demodulates the information and communicates it to application processor 690. While shown with this particular implementation in the embodiment of FIG. 8, understand the scope of the present invention is not limited in this regard.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. An apparatus comprising:
a power control circuit to receive a feedback signal from a power amplifier (PA) and to generate a first control signal to control a variable gain amplifier (VGA) based on the feedback signal, wherein the VGA is coupled to an input to the PA, the power control circuit including:
a mute circuit to generate a mute signal to be provided to the VGA when the first control signal is less than a first level; and
a clamp circuit to clamp a second control signal from exceeding a threshold level, the second control signal used to generate the first control signal.

2. The apparatus of claim 1, further comprising an integrator to integrate the feedback signal, an offset signal, and a ramp reference signal to obtain an integrator output corresponding to the second control signal.

3. The apparatus of claim 1, further comprising an output stage to provide the first control signal to the VGA, the output stage comprising a comparator to compare a first current output by a first switch device to a first reference current and to provide a difference between the first current and the first reference current as the first control signal.

4. The apparatus of claim 3, wherein the mute circuit comprises a second comparator to compare a second current output by a second switch device to a second reference current and to provide a difference between the second current and the second reference current as the mute signal.

5. The apparatus of claim 4, wherein the second current is less than the first current.

6. The apparatus of claim 4, further comprising a bias circuit to generate a bias signal for the clamp circuit, wherein the bias circuit comprises a third comparator to compare a third current output by a third switch device to a third reference current and to provide a difference between the third current and the third reference current as the bias signal.

7. The apparatus of claim 4, wherein the mute circuit is to further provide the mute signal to a gain stage coupled between the VGA and the PA.

8. The apparatus of claim 7, wherein the mute signal is to prevent a feed through signal from being output by the VGA or the gain stage when the PA is in an off-key state.

9. The apparatus of claim 2, wherein the power control circuit further comprises:
a replica circuit to generate a replica voltage, the replica voltage corresponding to the feedback signal when the PA outputs zero current;
a converter to convert the replica voltage to a replica current; and
a clamp bias circuit to generate a gate signal for the clamp circuit based on a second offset current.

10. The apparatus of claim 9, wherein the clamp circuit comprises a switch to clamp the second control signal when the switch is gated by the gate signal.

11. A method comprising:
receiving a feedback signal from an output of a power amplifier (PA);
combining a feedback current generated from the feedback signal with an offset current and a ramp current to obtain a current sum, and providing the current sum to an integrator having an integrator output;
providing a control signal to a variable gain amplifier (VGA) and amplifying a radio frequency (RF) signal using the VGA and at least one gain stage coupled between the VGA and the PA when the integrator output is within a first range; and
providing a mute signal that prevents a feed through signal from being amplified in at least one of the VGA and the at least one gain stage when the integrator output is within a second range in which the control signal is not provided.

12. The method of claim 11, further comprising clamping the integrator output from rising above a threshold level.

13. The method of claim 11, further comprising comparing a first current output by a first switch device enabled by the integrator output to a first reference current and providing a difference between the first current and the first reference current as the control signal.

14. The method of claim 13, further comprising comparing a second current output by a second switch device enabled by the integrator output to a second reference current and providing a difference between the second current and the second reference current as the mute signal.

15. The method of claim 14, wherein in an off-key state, first not providing the control signal, thereafter providing the mute signal, and thereafter preventing the integrator output from departing from the second range.

16. The method of claim 11, further comprising providing the mute signal during an off-key state and not providing the mute signal during an on-key state.

17. The method of claim 16, wherein the ramp current is zero in the off-key state.

18. A system comprising:
a processor;
a transmitter coupled to the processor and including:
   a variable gain amplifier (VGA) to receive and amplify a radio frequency (RF) signal;
   at least one gain stage coupled to an output of the VGA to further amplify the RF signal;
   a power amplifier (PA) coupled to the at least one gain stage to amplify the RF signal for transmission from the transmitter; and
   a power control circuit to receive a feedback signal from the PA to control the VGA based on the feedback signal, wherein the power control circuit is to enable the VGA during an on-keying state, and to disable the VGA during an off-keying state, and to further provide a mute signal to the VGA during the off-keying state to prevent a feed through signal from being amplified by the VGA.

19. The system of claim 18, wherein the power control circuit further comprises an integrator to generate a gate voltage for an output stage of the power control circuit that outputs a control signal to the VGA and a mute circuit of the power control circuit that provides the mute signal to the VGA.

20. The system of claim 19, wherein the power control circuit further comprises a clamp circuit to clamp the gate voltage at a predetermined level in the off-keying state.

* * * * *